(12) United States Patent
Zhou

(10) Patent No.: US 12,360,301 B2
(45) Date of Patent: Jul. 15, 2025

(54) DISPLAY PANEL

(71) Applicant: WUHAN CHINA STAR OPTOELECTRONICS SEMICONDUCTOR DISPLAY TECHNOLOGY CO., LTD., Wuhan (CN)

(72) Inventor: Jing Zhou, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 687 days.

(21) Appl. No.: 17/614,529

(22) PCT Filed: Nov. 8, 2021

(86) PCT No.: PCT/CN2021/129325
§ 371 (c)(1),
(2) Date: Nov. 28, 2021

(87) PCT Pub. No.: WO2023/070740
PCT Pub. Date: May 4, 2023

(65) Prior Publication Data
US 2023/0133676 A1    May 4, 2023

(30) Foreign Application Priority Data
Oct. 29, 2021    (CN) .......................... 202111271784.8

(51) Int. Cl.
*G02B 5/28* (2006.01)
*G06F 3/041* (2006.01)
(Continued)

(52) U.S. Cl.
CPC ........... *G02B 5/286* (2013.01); *G06F 3/0412* (2013.01); *G02F 1/133514* (2013.01); *H10K 59/38* (2023.02)

(58) Field of Classification Search
CPC . G02B 5/286; G06F 3/0412; G02F 1/133514; H10K 59/38
(Continued)

(56) References Cited

U.S. PATENT DOCUMENTS

2021/0335905 A1    10/2021    Lee et al.

FOREIGN PATENT DOCUMENTS

| CN | 111341815 A |   | 6/2020 |   |
|---|---|---|---|---|
| CN | 111554728 A | * | 8/2020 | ......... H01L 27/3218 |

(Continued)

*Primary Examiner* — Michael H Caley
*Assistant Examiner* — William D Peterson
(74) *Attorney, Agent, or Firm* — PV IP PC; Wei Te Chung

(57) ABSTRACT

A display panel includes a substrate; a light-emitting layer disposed on a side of the substrate and including a first sub-pixel displaying a first color, a second sub-pixel displaying a second color, and a third sub-pixel displaying a third color; and a color film layer disposed on a side of the light-emitting layer away from the substrate and including a first color resist corresponding to the first sub-pixel, a second color resist corresponding to the second sub-pixel, and a third color resist corresponding to the third sub-pixel; and wherein a first area ratio of the first color resist to the first sub-pixel is greater than a second area ratio of the second color resist to the second sub-pixel and a third area ratio of the third color resist to the third sub-pixel.

19 Claims, 10 Drawing Sheets

(51) Int. Cl.
*G02F 1/1335* (2006.01)
*H10K 59/38* (2023.01)

(58) Field of Classification Search
USPC .................................................. 257/51.001
See application file for complete search history.

(56) References Cited

FOREIGN PATENT DOCUMENTS

| | | | |
|---|---|---|---|
| CN | 111668274 | A | 9/2020 |
| CN | 111769143 | A | 10/2020 |
| CN | 112310322 | A | 2/2021 |
| CN | 112864202 | A | 5/2021 |
| CN | 113130608 | A | 7/2021 |
| JP | 2004103519 | A | 4/2004 |

* cited by examiner

DISPLAY PANEL

CROSS REFERENCE TO RELATED APPLICATIONS

This application is a National Phase of PCT Patent Application No. PCT/CN2021/129325 having International filing date of Nov. 8, 2021, which claims the benefit of priority of Chinese Patent Application No. 202111271784.8, filed Oct. 29, 2021, the contents of which are all incorporated herein by reference in their entirety.

BACKGROUND OF INVENTION

Field of Invention

The present application relates to a field of display technology, and particularly relates to a display panel.

Description of Prior Art

In general display panels, although polarizers (POL) can effectively reduce a reflectivity under a glare where the display panels are, it loses almost 58% of light emission. This causes a great burden for organic light-emitting diode (OLED) panels and shortens their service life.

On the other hand, the polarizers have large thickness, brittle property, etc., which is unfavorable for development of dynamic bending products. For developing a dynamic bending product on the basis of OLED display technology, new material, new technology, and new processes need to import to replace the polarizers.

In current display panels using polarizers, technical problems of loss light emission and unfavorable for development of dynamic bending products exist.

SUMMARY OF INVENTION

On the basis of the aforesaid purpose, the present application provides a display panel, including: a substrate; a light-emitting layer disposed on a side of the substrate and including a first sub-pixel displaying a first color, a second sub-pixel displaying a second color, and a third sub-pixel displaying a third color; and a color film layer disposed on a side of the light-emitting layer away from the substrate and including a first color resist corresponding to the first sub-pixel, a second color resist corresponding to the second sub-pixel, and a third color resist corresponding to the third sub-pixel; and wherein a first area ratio of the first color resist to the first sub-pixel is greater than a second area ratio of the second color resist to the second sub-pixel and a third area ratio of the third color resist to the third sub-pixel.

In one embodiment of the present application, the display panel further includes a pixel definition layer disposed between the substrate and the light-emitting layer, wherein a plurality of first openings are defined in the pixel definition layer, and the first sub-pixel, the second sub-pixel, and the third sub-pixel are disposed in the plurality of first openings; and a black matrix layer, wherein the black matrix layer is disposed between the light-emitting layer and the color film layer, a plurality of second openings are defined in the black matrix layer, and the first color resist, the second color resist, and the third color resist are disposed in the plurality of second openings.

In one embodiment of the present application, an area of the second openings corresponding to the first sub-pixel and an area of the first color resist are greater than an area of the first sub-pixel; an area of the second openings corresponding to the second sub-pixel and an area of the second color resist are greater than an area of the second sub-pixel; and an area of the second openings corresponding to the third sub-pixel and an area of the third color resist are greater than an area of the third sub-pixel.

In one embodiment of the present application, on the side of the substrate where the light-emitting layer is disposed, a first lateral edge of a first orthogonal projection of the color film layer disposed in the second openings completely overlaps with a second orthogonal projection of the black matrix layer.

In one embodiment of the present application, on the side of the substrate where the light-emitting layer is disposed, a first lateral edge of a first orthogonal projection of the color film layer disposed in the second openings completely overlaps with a second orthogonal projection of the black matrix layer.

In one embodiment of the present application, on the side of the substrate where the light-emitting layer is disposed, a first lateral edge of a first orthogonal projection of the color film layer disposed in the second openings partially overlaps with a second orthogonal projection of the black matrix layer, and a gap between the first lateral edge of the first orthogonal projection and a second lateral edge of the second orthogonal projection overlaps with a third orthogonal projection of the pixel definition layer.

In one embodiment of the present application, on the side of the substrate where the light-emitting layer is disposed, a gap is between a first lateral edge of a first orthogonal projection of the color film layer disposed in the second openings and a second lateral edge of a second orthogonal projection of the black matrix layer, and a gap between the first lateral edge of the first orthogonal projection and a second lateral edge of the second orthogonal projection overlaps with a third orthogonal projection of the pixel definition layer.

In one embodiment of the present application, the plurality of first openings include a first sub-opening corresponding to the first sub-pixel, a second sub-opening corresponding to the second sub-pixel, and a third sub-opening corresponding to the third sub-pixel; the plurality of second openings include a fourth sub-opening corresponding to the first color resist, a fifth sub-opening corresponding to the second color resist, a sixth sub-opening corresponding to the third color resist; and wherein a fourth area ratio of the fourth sub-opening to the first sub-opening is greater than a fifth area ratio of the fifth sub-opening to the second sub-opening and a sixth area ratio of the sixth sub-opening to the third sub-opening.

In one embodiment of the present application, colors of the first color and the first color resist are same, colors of the second color and the second color resist are same, colors of the third color and the third color resist are same, and the fourth area ratio, the fifth area ratio, and the sixth area ratio range from 1 to 2.5.

In one embodiment of the present application, the first color is red, the fourth area ratio of the fourth sub-opening to the first sub-opening ranges from 1.35 to 1.4, and chamfers are configured in the fourth sub-opening and the first sub-opening.

In one embodiment of the present application, the second color is green, the fifth area ratio of the fifth sub-opening to the second sub-opening ranges from 0.9 to 1.1, and the fifth sub-opening and the second sub-opening are elliptical.

In one embodiment of the present application, the third color is blue, the sixth area ratio of the sixth sub-opening to the third sub-opening ranges from 1.1 to 1.15, and chamfers are configured in the sixth sub-opening and the third sub-opening.

The present application further provides a display panel, including: a substrate; a light-emitting layer disposed on a side of the substrate and including a first sub-pixel displaying a first color, a second sub-pixel displaying a second color, and a third sub-pixel displaying a third color; and a color film layer disposed on a side of the light-emitting layer away from the substrate and including a first color resist corresponding to the first sub-pixel, a second color resist corresponding to the second sub-pixel, and a third color resist corresponding to the third sub-pixel; and an encapsulation layer disposed on the light-emitting layer, wherein a first area ratio of the first color resist to the first sub-pixel is greater than a second area ratio of the second color resist to the second sub-pixel and a third area ratio of the third color resist to the third sub-pixel.

In one embodiment of the present application, the display panel further includes a pixel definition layer disposed between the substrate and the light-emitting layer, wherein a plurality of first openings are defined in the pixel definition layer, and the first sub-pixel, the second sub-pixel, and the third sub-pixel are disposed in the plurality of first openings; a black matrix layer, wherein the black matrix layer is disposed between the light-emitting layer and the color film layer, a plurality of second openings are defined in the black matrix layer, and the first color resist, the second color resist, and the third color resist are disposed in the plurality of second openings; and a touch structure disposed on the encapsulation layer, wherein the encapsulation layer covers the light-emitting layer and the pixel definition layer.

In one embodiment of the present application, the touch structure includes a metal wiring layer, and an orthogonal projection of the black matrix layer completely covers the metal wiring layer in a surface of the substrate where the pixel definition layer is disposed.

In one embodiment of the present application, an area of the second openings corresponding to the first sub-pixel and an area of the first color resist are greater than an area of the first sub-pixel; an area of the second openings corresponding to the second sub-pixel and an area of the second color resist are greater than an area of the second sub-pixel; and an area of the second openings corresponding to the third sub-pixel and an area of the third color resist are greater than an area of the third sub-pixel.

In one embodiment of the present application, on the side of the substrate where the light-emitting layer is disposed, a first lateral edge of a first orthogonal projection of the color film layer disposed in the second openings completely overlaps with a second orthogonal projection of the black matrix layer.

In one embodiment of the present application, on the side of the substrate where the light-emitting layer is disposed, a first lateral edge of a first orthogonal projection of the color film layer disposed in the second openings partially overlaps with a second orthogonal projection of the black matrix layer, and a gap between the first lateral edge of the first orthogonal projection and a second lateral edge of the second orthogonal projection overlaps with a third orthogonal projection of the pixel definition layer.

In one embodiment of the present application, on the side of the substrate where the light-emitting layer is disposed, a gap is between a first lateral edge of a first orthogonal projection of the color film layer disposed in the second openings and a second lateral edge of a second orthogonal projection of the black matrix layer, and a gap between the first lateral edge of the first orthogonal projection and a second lateral edge of the second orthogonal projection overlaps with a third orthogonal projection of the pixel definition layer.

In one embodiment of the present application, the plurality of first openings include a first sub-opening corresponding to the first sub-pixel, a second sub-opening corresponding to the second sub-pixel, and a third sub-opening corresponding to the third sub-pixel; the plurality of second openings include a fourth sub-opening corresponding to the first color resist, a fifth sub-opening corresponding to the second color resist, a sixth sub-opening corresponding to the third color resist; and wherein a fourth area ratio of the fourth sub-opening to the first sub-opening is greater than a fifth area ratio of the fifth sub-opening to the second sub-opening and a sixth area ratio of the sixth sub-opening to the third sub-opening.

In one embodiment of the present application, colors of the first color and the first color resist are same, colors of the second color and the second color resist are same, colors of the third color and the third color resist are same, and the fourth area ratio, the fifth area ratio, and the sixth area ratio range from 1 to 2.5.

In the display panel provide by the present application, the black matrix layer and the color film layer disposed on the encapsulation layer can be used to replace polarizers in the prior art and to optimize an aperture ratio, so that effects of reducing a thickness of the display panel and increasing a light emission rate can be realized.

DETAILED DESCRIPTION OF EMBODIMENTS

Figure 1:
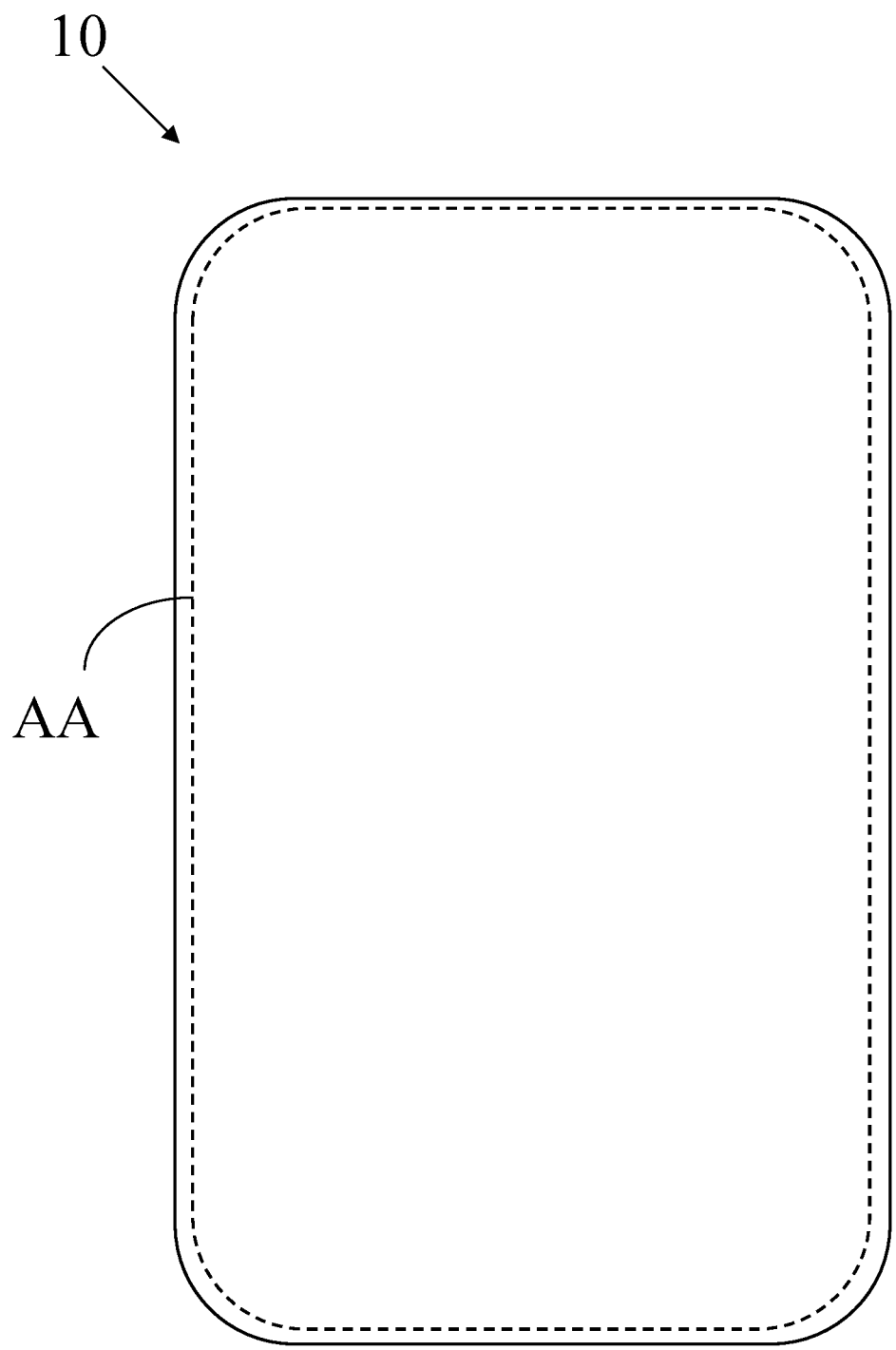
FIG. 1 is a schematic diagram of a display panel of the present application.

In order to allow the above and other purposes, features, and advantages of the present application to be more obvious and easier to understand, preferred embodiments of the present application will be particularly described hereinafter, and with reference to the accompanying drawings, a detailed description will be given below. Moreover, the directional terms of which the present application mentions, for example, "upper", "lower", "top", "bottom", "front", "rear", "left", "right", "inside", "outside", "side", "circumference", "center", "horizontal", "vertical", "axial", "radial", "top layer", "bottom layer", etc., only refer to directions of the accompanying figures. Therefore, the used directional terms are for illustrating and understanding the present application, but not for limiting the present application.

In the figures, units with similar structures are indicated by the same reference numerals.

As illustrated in FIG. 1, the display panel 10 of the present application has an active display region AA (active area) for displaying images. Furthermore, the display panel 10 can be a screen with a display function, for example, a screen of a mobile phone, a computer, or a wearable device.

Figure 2:
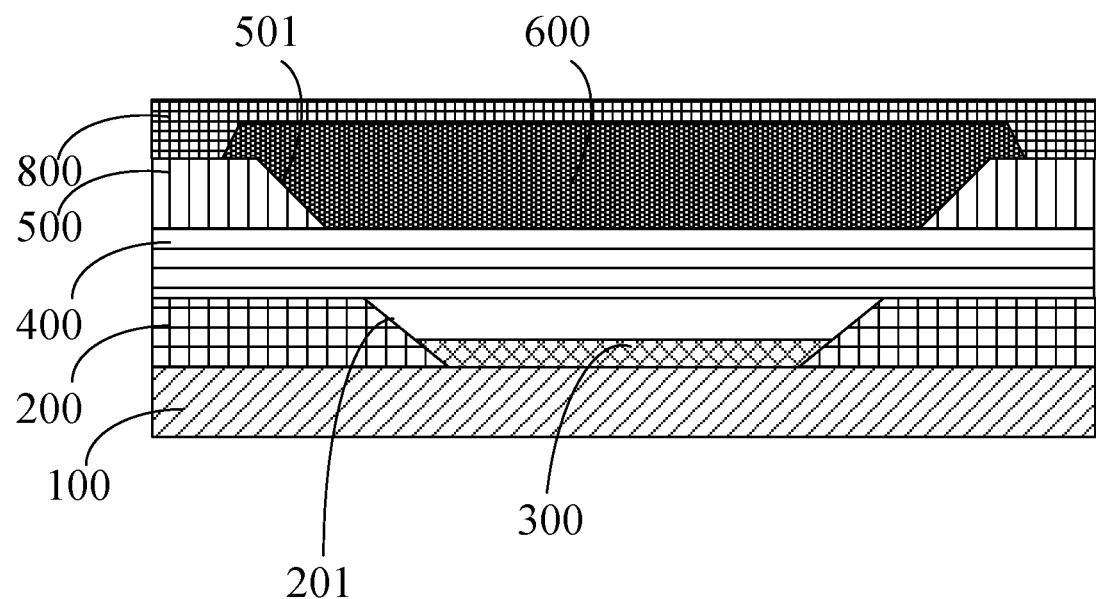
FIG. 2 is a first sectional view of the display panel of the present application.

As illustrated in FIG. 2, the display panel 10 of the present application can include a substrate 100, a pixel definition layer 200, a light-emitting layer 300, an encapsulation layer 400, a black matrix layer 500, and a color film layer 600 disposed in the active display region AA.

Furthermore, the substrate 100 can be an array substrate and can include elements such as transistors, common electrodes, etc. In one embodiment, when manufacturing display panel 10 of the present application, a flexible substrate can be formed by depositing polyimide (PI) on a substrate, such as a glass substrate. Then, manufacture of the substrate 100, the pixel definition layer 200, the light-emitting layer 300, the encapsulation layer 400 is completed in sequence. After that, the black matrix layer 500 and the color film layer 600 are manufactured. Finally, an adhesive, such as optical clear adhesive (OCA), is coated to form an adhesive layer 800 for subsequent assembly with other module materials. Therefore, the display panel 10 of the present application is a polarizer-less (POL-Less) display panel 10.

Furthermore, the pixel definition layer 200 can be disposed between the substrate 100 and the light-emitting layer 300, and a plurality of first openings 201 are defined in the pixel definition layer 200. In one embodiment, the pixel definition layer 200 can be made of a transparent material or a black organic material. The plurality of first openings 201 can be defined in the pixel definition layer 200 by an etching manner.

Figure 9:
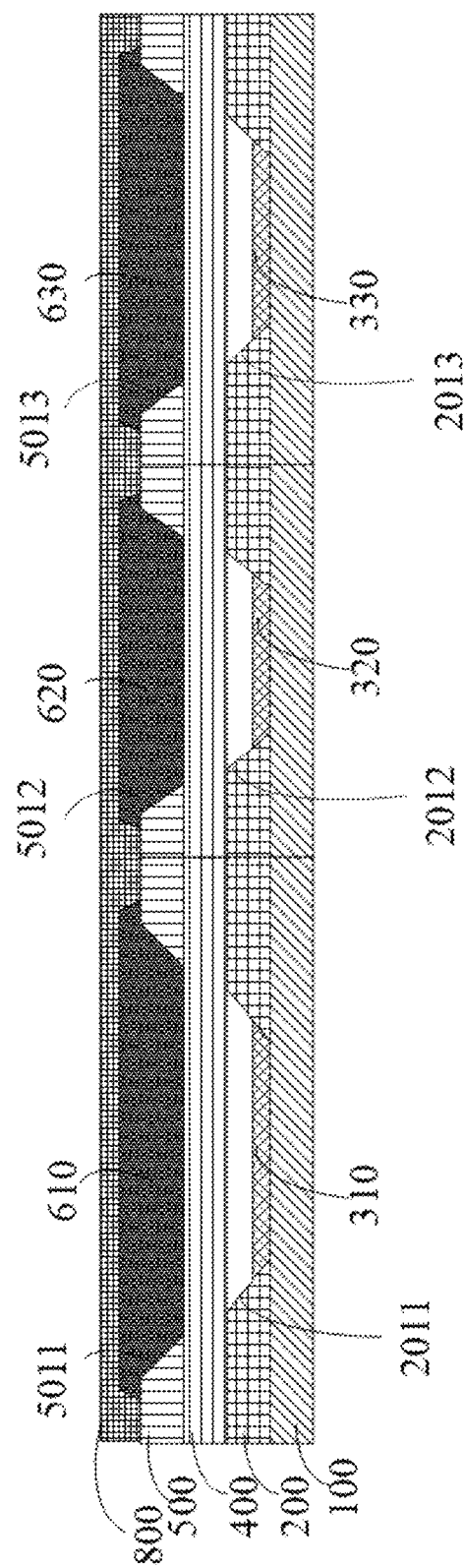
FIG. 9 is a fifth sectional view of the display panel of the present application.

The light-emitting layer 300 can be disposed on a side of the substrate 100. In one embodiment, as illustrated in FIG. 9, the light-emitting layer 300 can include a first sub-pixel 310 displaying a first color, a second sub-pixel 320 displaying a second color, and a third sub-pixel 330 displaying a third color, and the first sub-pixel 310, the second sub-pixel 320, and the third sub-pixel 330 are disposed in the plurality of first openings 201. Specifically, the first sub-pixel 310, the second sub-pixel 320, and the third sub-pixel 330 can be a red sub-pixel, a green sub-pixel, and a blue sub-pixel respectively.

In one embodiment, the light-emitting layer 300 can include organic light emitting diodes (OLEDs). The OLEDs can be red OLEDs, green OLEDs, or blue OLEDs.

In one embodiment, the encapsulation layer 400 can cover the pixel definition layer 200 and the light-emitting layer 300. In addition, the encapsulation layer 400 can be a thin-film encapsulation (TFE) layer. TFE is a technology that inorganic film layers and organic film layers are stacked on an organic material layer to prevent external pollution. Inorganic film layers can prevent penetration. However, property of the inorganic film layers is uneven, and organic film layers can help stabilize the inorganic film layers.

The black matrix layer 500 is disposed between the light-emitting layer 300 and the color film layer 600 and can be disposed on the encapsulation layer 400 corresponding to the light-emitting layer 300 and the pixel definition layer 200. A plurality of second openings 501 can be defined in the black matrix layer 500. A color film layer 600 can be filled in the second openings 501.

Furthermore, as illustrated in FIG. 2 to FIG. 9, the color film layer 600 is disposed on a side of the light-emitting layer 300 away from the substrate and includes a first color resist 610 corresponding to the first sub-pixel 310, a second color resist 620 corresponding to the second sub-pixel 320, and a third color resist 630 corresponding to the third sub-pixel 330; and The first color resist 610, the second color resist 620, and the third color resist 630 are disposed in the plurality of second openings 501. In addition, in one embodiment, the first color resist 610, the second color resist 620, and the third color resist 630 can be a red color resist, a green color resist, and a blue color resist respectively.

In one embodiment, a first area ratio of the first color resist 610 to the first sub-pixel 310 is greater than a second area ratio of the second color resist 620 to the second sub-pixel 320 and a third area ratio of the third color resist 630 to the third sub-pixel 330.

In one embodiment, the color film layer 600 can be disposed corresponding to a position of the light-emitting layer 300 to correspond light emitted from the light-emitting layer 300 and to prevent interference of ambient light. Furthermore, the black matrix layer 500 can prevent light leakage and has an effect of reducing reflection.

Specifically, in one embodiment, as illustrated in FIG. 2 to FIG. 9, an area of the second openings 501 corresponding to the first sub-pixel 310 and an area of the first color resist 310 are greater than an area of the first sub-pixel 310; an area of the second openings 501 corresponding to the second sub-pixel 320 and an area of the second color resist 620 are greater than an area of the second sub-pixel 320; and an area of the second openings 501 corresponding to the third sub-pixel 330 and an area of the third color resist 630 are greater than an area of the third sub-pixel 330.

Therefore, in the display panel 10 of the present application, the black matrix layer 500 and the color film layer 600 disposed on the encapsulation layer 400 is used to replace polarizers in the prior art to realize effects of reducing a thickness of the display panel 10 and increasing a light emission rate.

In one embodiment, the display panel 10 of the present application can also have a touch function. As illustrated in FIG. 3, FIG. 5, FIG. 7, and FIG. 9, the display panel 10 can further includes a touch structure 700. The touch structure 700 can be disposed on the encapsulation layer 400. The black matrix layer 500 and the color film layer 600 can be disposed on the touch structure 700. The touch structure 700 can include a metal wiring layer 701. Furthermore, in one embodiment, the touch structure 700 relates to integrated touch technology, i.e., the display panel 10 of the present application can highly integrate display and touch functions. By integrating touch and display technologies into single-chip and dual-chip solutions, the display panel 10 is allowed to be lighter and thinner.

In one embodiment, as illustrated in FIG. 3, FIG. 5, FIG. 7, and FIG. 9, in order to prevent the metal wiring layer 701 from affecting display of the display panel 10, the metal wiring layer 701 can be disposed corresponding to the black matrix layer 500, i.e., an orthogonal projection of the black matrix layer 500 completely covers the metal wiring layer 701 in a surface of the substrate 100 where the pixel definition layer 200 is disposed.

Figure 3:
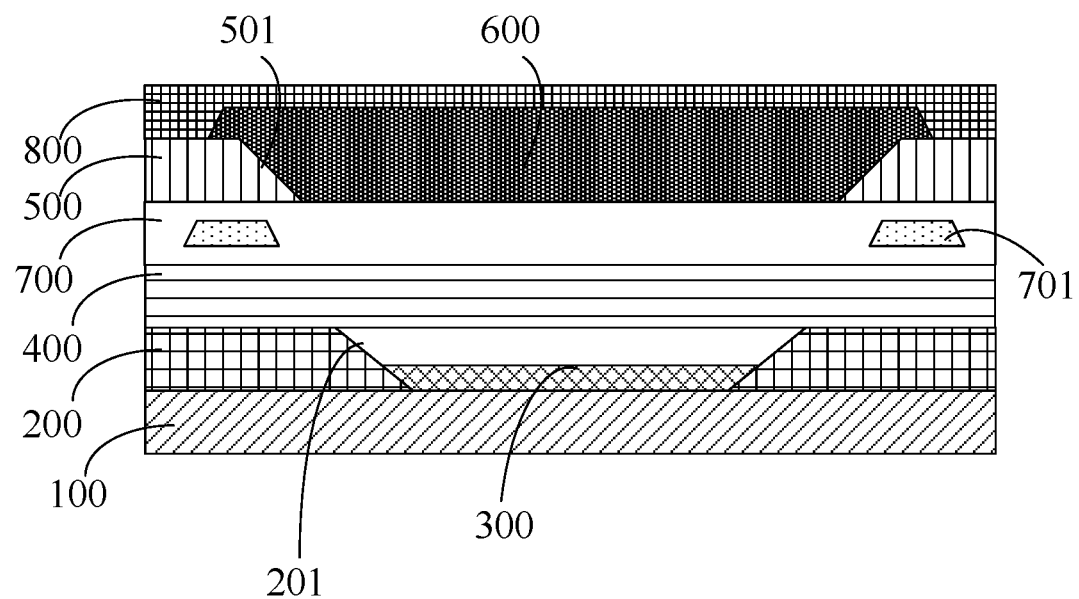
FIG. 3 is a second sectional view of the display panel of the present application.
Figure 4:
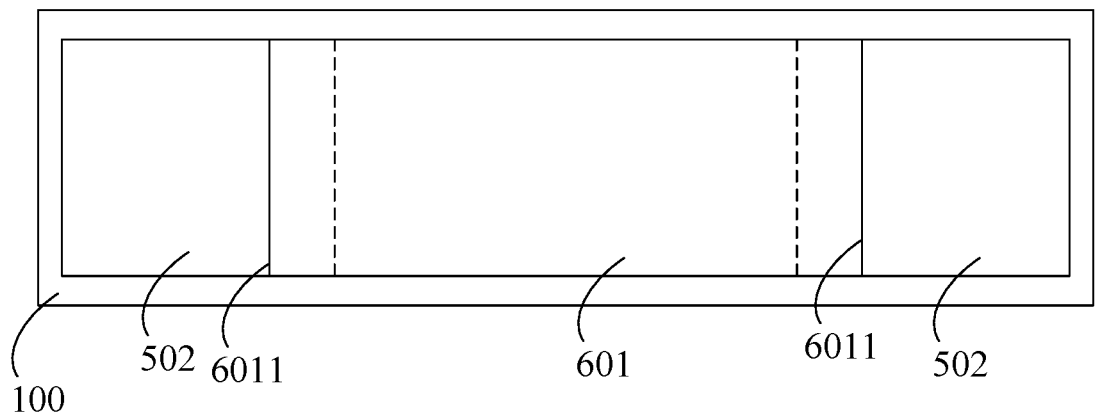
FIG. 4 is a first schematic diagram of orthogonal projections of elements of the display panel of the present application.

In one embodiment, as illustrated in FIG. 3 and FIG. 4, on the side of the substrate 100 where the light-emitting layer 300 is disposed, a first lateral edge 6011 of a first orthogonal projection 601 of the color film layer 600 disposed in the second openings 501 completely overlaps with a second orthogonal projection 502 of the black matrix layer 500. Therefore, the color film layer 600 and the black matrix layer 500 can completely cover corresponding light-emitting layer 300 to correspond to the light emitted from the light-emitting layer 300 and prevent interference of ambient light.

Figure 5:
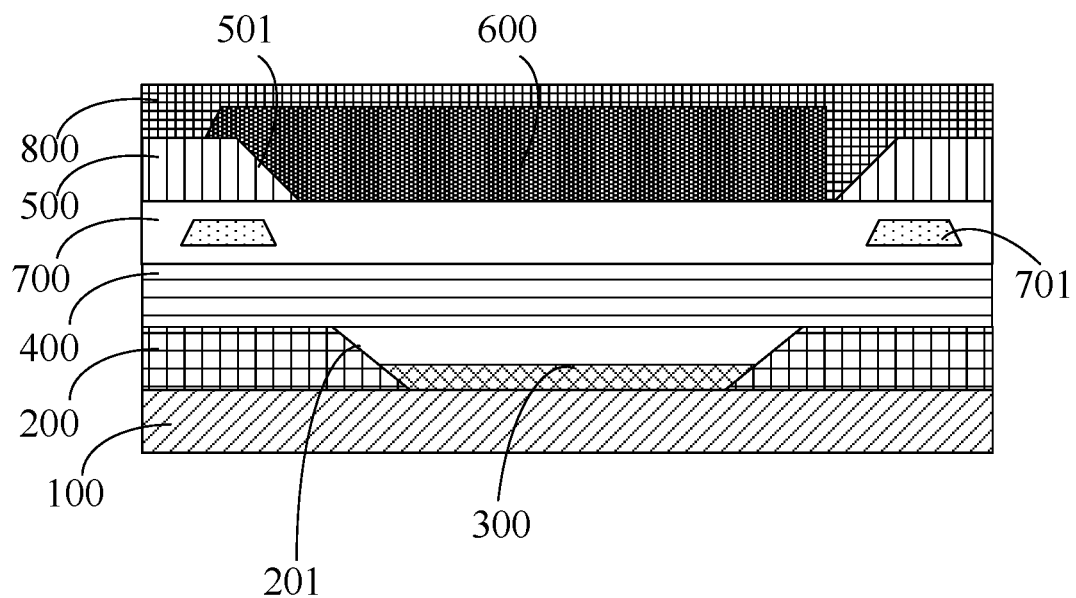
FIG. 5 is a third sectional view of the display panel of the present application.
Figure 6:
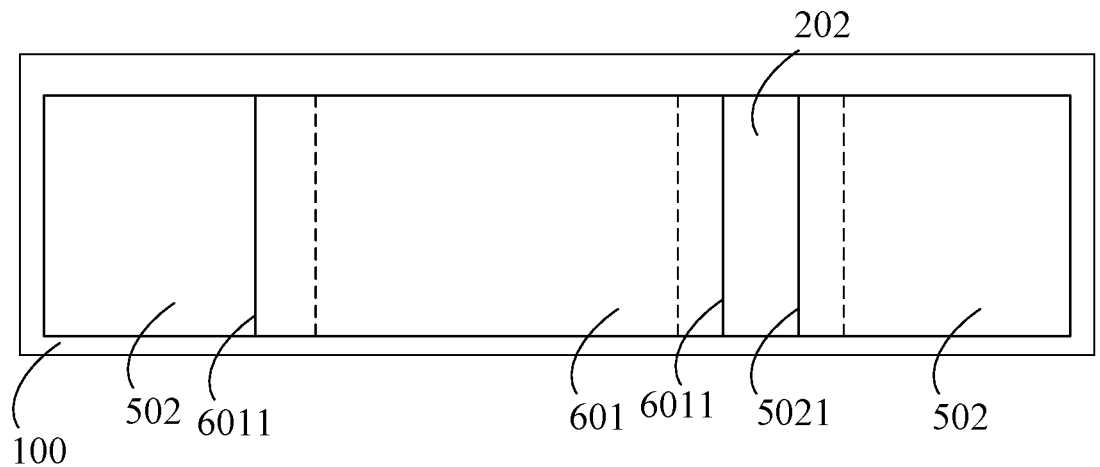
FIG. 6 is a second schematic diagram of the orthogonal projections of the elements of the display panel of the present application.

In another embodiment, as illustrated in FIG. 5 and FIG. 6, on the side of the substrate 100 where the light-emitting layer 300 is disposed, the first lateral edge 6011 of the first orthogonal projection 601 of the color film layer 600 disposed in the second openings 501 partially overlaps with the second orthogonal projection 502 of the black matrix layer 500, and a gap between the first lateral edge 6011 of the first orthogonal projection 601 and a second lateral edge 5021 of the second orthogonal projection 502 overlaps with a third orthogonal projection 202 of the pixel definition layer 200. Therefore, the color film layer 600 and the black matrix layer 500 can completely cover corresponding light-emitting layer 300 to correspond to the light emitted from the light-emitting layer 300 and prevent interference of ambient light.

Figure 7:
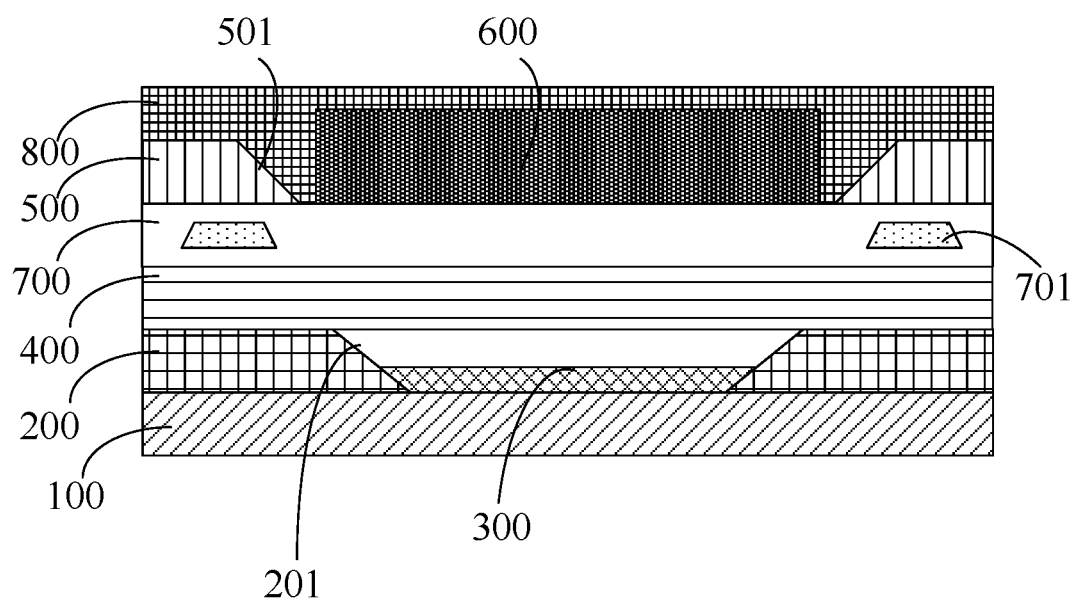
FIG. 7 is a fourth sectional view of the display panel of the present application.
Figure 8:
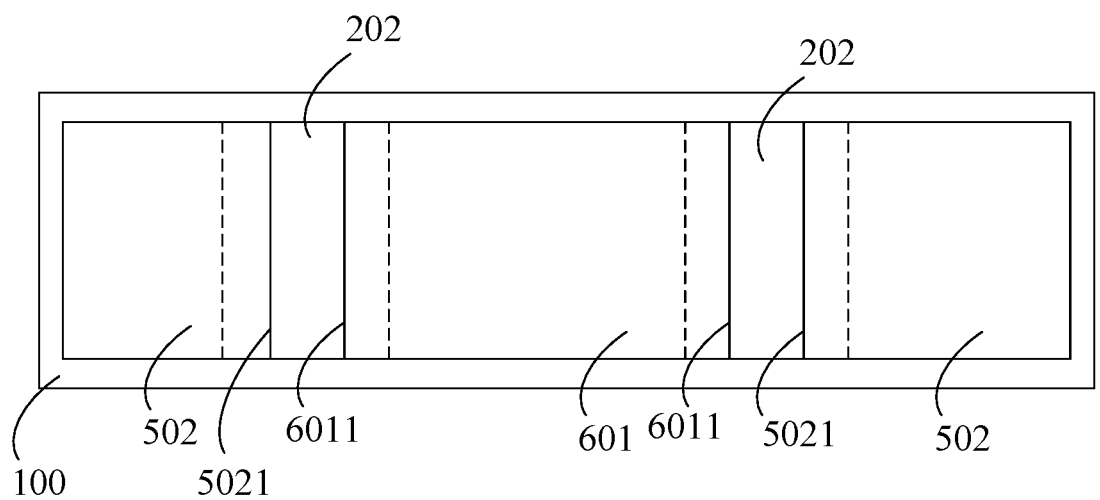
FIG. 8 is a third schematic diagram of the orthogonal projections of the elements of the display panel of the present application.

In one further embodiment, as illustrated in FIG. 7 and FIG. 8, on the side of the substrate 100 where the light-emitting layer 300 is disposed, a gap is between the first lateral edge 6011 of the first orthogonal projection 601 of the color film layer 600 disposed in the second openings 501 and the second lateral edge 5021 of the second orthogonal projection 502 of the black matrix layer 500, and the gap between the first lateral edge 6011 of the first orthogonal projection 601 and the second lateral edge 5021 of the second orthogonal projection 502 overlaps with the third orthogonal projection 202 of the pixel definition layer. Therefore, the color film layer 600 and the black matrix layer 500 can completely cover corresponding light-emitting layer 300 to correspond to the light emitted from the light-emitting layer 300 and prevent interference of ambient light.

Furthermore, in one embodiment, as illustrated in FIG. 9, the plurality of first openings 201 can include a first sub-opening 2011 corresponding to the first sub-pixel 310, a second sub-opening 2012 corresponding to the second sub-pixel 320, and a third sub-opening 2013 corresponding to the third sub-pixel 330; the plurality of second openings 501 include a fourth sub-opening 5011 corresponding to the first color resist 610, a fifth sub-opening 5012 corresponding to the second color resist 620, a sixth sub-opening 5013 corresponding to the third color resist 630; and wherein a fourth area ratio of the fourth sub-opening 5011 to the first sub-opening 2011 is greater than a fifth area ratio of the fifth sub-opening 5012 to the second sub-opening 2012 and a sixth area ratio of the sixth sub-opening 5013 to the third sub-opening 2013.

In one embodiment, colors of lights emitted from the light-emitting layer 300 are same as colors of the color film layer 600, i.e., the first color is same as the color of the first color resist 610, the second color is same as the color of the second color resist 620, and the third color is same as the color of the third color resist 630. In addition, in one embodiment, the fourth area ratio, the fifth area ratio, and the sixth area ratio range from 1 to 2.5.

Specifically, the display panel 10 of FIG. 9 is taken as an example for description. The structure of FIG. 9 is similar to the structure of FIG. 3. The difference between FIG. 9 and FIG. 3 is that the first sub-pixel 310, the second sub-pixel 320, the third sub-pixel 330, the first color resist 610, the second color resist 620, and the third color resist 630 are further illustrated in FIG. 9.

It should be noted that in the embodiments of FIG. 3 to FIG. 8, the light-emitting layer 300 can be regarded as the first sub-pixel 310, the second sub-pixel 320, or the third sub-pixel 330, and the color film layer 600 can be regarded as any one of the first color resist 610, the second color resist 620, or the third color resist 630, but the colors of the lights emitted from the light-emitting layer 300 should be same as the colors of the color film layer 600. In other words, in the embodiments of FIG. 3 to FIG. 8, if the light-emitting layer 300 is the first sub-pixel 310, the color filter layer 600 directly above the light-emitting layer 300 is the first color resist 610.

Therefore, as illustrated in FIG. 9, right above the first sub-pixel 310 is the first color resist 610, right above the second sub-pixel 320 is the second color resist 620, and right above the third sub-pixel 330 is the third color resist 630.

In one embodiment, when the color film layer 600 is the first color resist 610, i.e., when the first color is red, the fourth area ratio of the fourth sub-opening 5011 to the first sub-opening 2011 ranges from 1.35 to 1.4, and chamfers are configured in the fourth sub-opening 5011 and the first sub-opening 2011 to make the display panel 10 of the present application have a better display effect.

In one embodiment, when the color film layer 600 is the second color resist 620, i.e., when the second color is green the fifth area ratio of the fifth sub-opening 5012 to the second sub-opening 2012 ranges from 0.9 to 1.1, and the fifth sub-opening 5012 and the second sub-opening 2012 are elliptical to make the display panel 10 of the present application have a better display effect.

In one embodiment, when the color film layer 600 is the third color resist 630, i.e., when the first color is blue, the sixth area ratio of the sixth sub-opening 5013 to the third sub-opening 2013 ranges from 1.1 to 1.15, and chamfers are configured in the sixth sub-opening 5013 and the third sub-opening 2013 to make the display panel 10 of the present application have a better display effect.

In detail, the area ratios of the second openings 501 to the first openings 201 and values of the color film layer 600 of different colors can refer to table 1.

TABLE 1 area ratio of second openings to first openings

| Number | first color resist | second color resist | third color resist | Shape of first openings |
|---|---|---|---|---|
| Split 1 | 1.4 | 0.9 | 1.15 | normal |
| Split 2 | 1.4 | 0.9 | 1.15 | four retracted corners |
| Split 3 | 1.35 | 1.1 | 1.1 | four retracted corners |

The display effect corresponding to the values in table 1 can be shown in table 2. In addition, in table 1, the first color resist is a red color resist, the second color resist is a green color resist, and the third color resist is a blue color resist.

TABLE 2

| | power consumption(W) | color gamut (NTSC) | uniformity (L255) brightness | uniformity (L255) chromaticity | WAD (30°, 45°, 60°) | L-Decay | reflectivity | Hue (L, a, b) |
|---|---|---|---|---|---|---|---|---|
| Prior art(polarizer) | 1.99 | 101.0% | 81.9% | 0.012 | 4.8/6.6/5.4 | 44.2 | 4.6 | (25.7, −0.1, −0.5) |
| Split 1 | 1.51 | 113.6% | 86.1% | 0.013 | 6.2/9.0/9.6 | 35.1 | 5.8 | (28.9, −0.5, −3.4) |
| Split 2 | 1.5 | 114.7% | 88.3% | 0.010 | 6.0/8.8/9.5 | 33.9 | 5.8 | (28.9, −1.4, −2.9) |
| Split 3 | 1.45 | 113.2% | 87.1% | 0.011 | 6.0/8.3/7.9 | 35 | 6 | (29.4, −3.4, −1.5) |

In table 2, the power consumption represents the power consumption of lighting a screen of the display panel 10. Here, the power consumption of the light-emitting layer 300 does not include power consumption of driving circuits such as chips.

Color gamut refers to a sum of colors under the national television system committee (NTSC) standard, and the larger the value is, the better the display effect is.

Uniformity (an actual brightness of sub-pixels under 255 gray scale, L255) refers to uniformity of brightness and chromaticity in different regions of a same screen. White angular dependence (WAD) refers to a color shift situation of the display panel 10. Table 2 is represented by the "JNCD" index of (30°, 45°, 60°), and wherein JNCD is "Just Noticeable Color Difference", which is a standard for measuring color accuracy of the screen. The smaller the value is, the more accurate the color displayed on the screen is.

Luminance-decay (L-Decay) is a brightness viewing angle, which means that the brightness of the screen is attenuated by 50% when deviates from a certain angle, and this angle can range from 30° to 40°. Reflectivity refers to a reflectivity when the screen is turned off, this value should be as small as possible.

Hue (Lab) represents the chromaticity of the colors and represents hue when the screen is turned off, wherein "L" represents brightness of colors, "a" represents values from magenta to green, and "b" represents values from yellow to blue. Combined with the reflectivity, Lab should be as small as possible.

Wherein, the WAD indicator is the most important of all indicators, which is an important indicator that indicates whether the colors emitted from the screen is standard or not. Therefore, combined table 1 and table 2, it can be understood that under the configuration of FIG. 9, Split3 can have the best display effect.

In the present application, the POL-Less technology of using a color filter, i.e., the color filter layer 600 and the black matrix layer 500, to replace the polarizer (POL), which can not only reduce a thickness of functional layers from about 100 μm to less than 5 μm, but also the light emission rate can be increased from 42% to 60%. In the present application, the aforesaid embodiments and each value thereof are used to provide the display panel 10 having an excellent viewing angle of light emission and power consumption.

Figure 10:
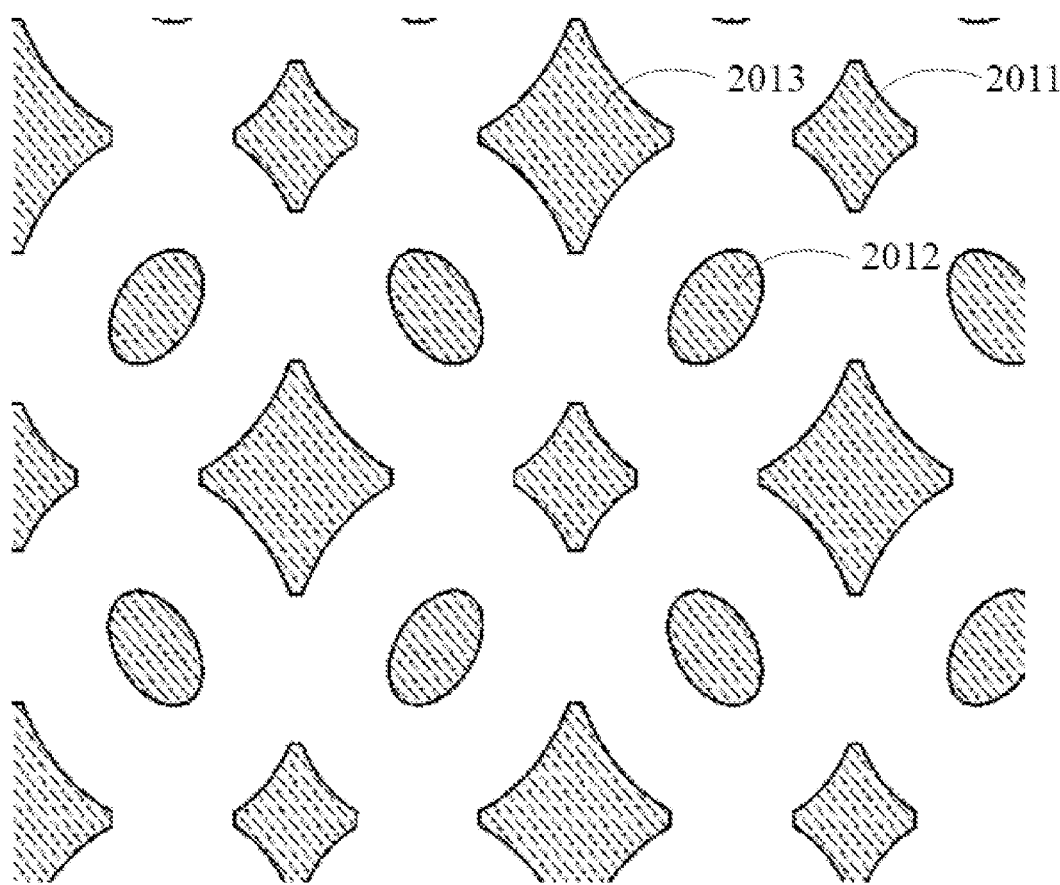
FIG. 10 is top view of first openings of the display panel of the present application.

Furthermore, as the first sub-opening 2011, the second sub-opening 2012, and the third sub-opening 2013 correspond to the first color resist 610, the second color resist 620, and the third color resist 630 respectively, as illustrated in FIG. 10, the first sub-opening 2011 allow red light to pass through, the second sub-opening 2012 allow green light to pass through, and the third sub-opening 2013 allow blue light to pass through. Chamfers can be configured in the first sub-opening 2011 and the third sub-opening 2013, and the sub-opening 2012 can be elliptical.

Figure 11:
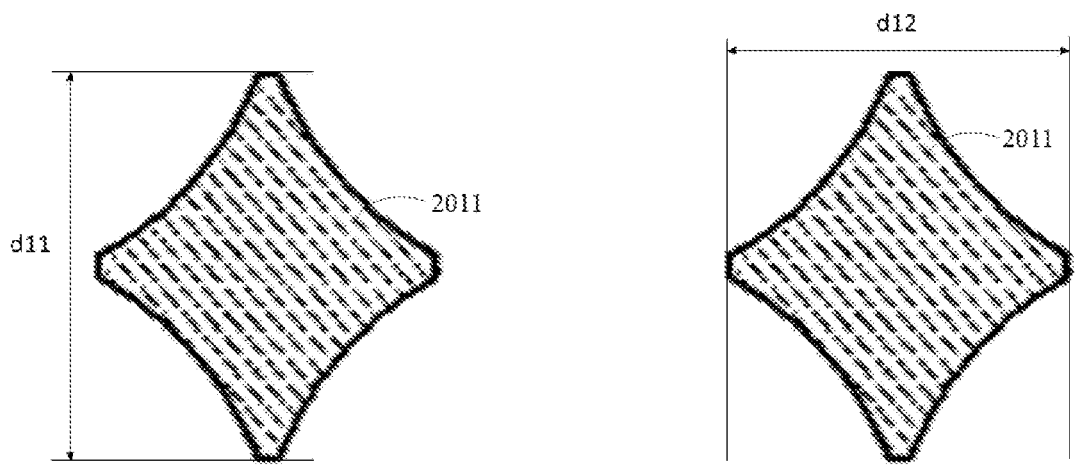
FIG. 11 is a schematic diagram of a first sub-opening of the display panel of the present application.
Figure 12:
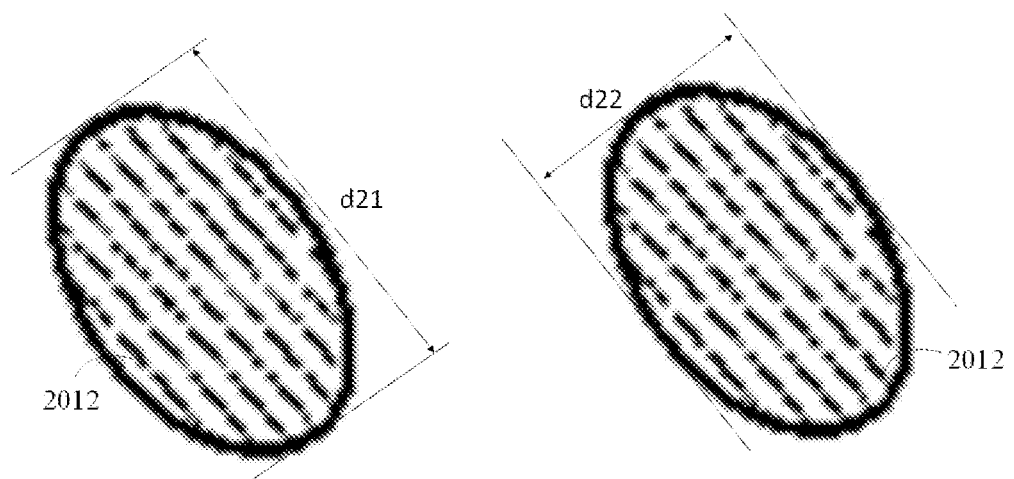
FIG. 12 is a schematic diagram of a second sub-opening of the display panel of the present application.
Figure 13:
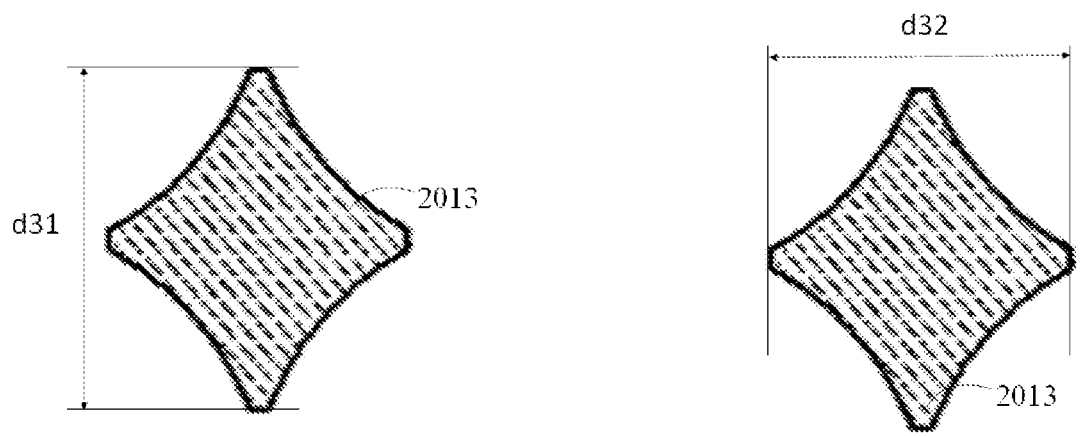
FIG. 13 is a schematic diagram of a third sub-opening of the display panel of the present application.

Please refer to FIG. 11 to FIG. 13. In the number Split1 in table 1, a first length d11 of the first sub-opening 2011 can be 28.48 μm, a first width d12 of the first sub-opening 2011 can be 28.48 μm, a second length d21 of the second sub-opening 2012 can be 25.83 μm, a second length d22 of the second sub-opening 2012 can be 17.03 μm, a third length d31 of the third sub-opening 2013 can be 44.38 μm, and a third width d32 of the third sub-opening 2013 can be 44.38 μm.

In the number Split2 in table 1, the first length d11 of the first sub-opening 2011 can be 26.00 μm, the first width d12 of the first sub-opening 2011 can be 26.00 μm, the second length d21 of the second sub-opening 2012 can be 25.83 μm, the second length d22 of the second sub-opening 2012 can be 17.03 μm, the third length d31 of the third sub-opening 2013 can be 40.00 μm, and the third width d32 of the third sub-opening 2013 can be 40.00 μm. In other words, compared to the first sub-opening 2011 and the third sub-opening 2013 in number Split1 in table 1, four corners of the first sub-opening 2011 and the third sub-opening 2013 of number Split2 in table 1 are retracted. In addition, in one embodiment, radii of curvature of arc parts of the first sub-opening 2011 and the third sub-opening 2013 of number Split2 in Table 1 can remain unchanged, or can also be adjusted according to requirements.

In the number Split3 in table 1, the first length d11 of the first sub-opening 2011 can be 24.00 μm, the first width d12 of the first sub-opening 2011 can be 24.00 μm, the second length d21 of the second sub-opening 2012 can be 25.83 μm, the second length d22 of the second sub-opening 2012 can be 17.03 μm, the third length d31 of the third sub-opening 2013 can be 36.00 µm, and the third width d32 of the third sub-opening 2013 can be 36.00 µm. In other words, compared to the first sub-opening 2011 and the third sub-opening 2013 in number Split1 in table 1, four corners of the first sub-opening 2011 and the third sub-opening 2013 of number Split3 in table 1 are retracted. In addition, in one embodiment, radii of curvature of arc parts of the first sub-opening 2011 and the third sub-opening 2013 of number Split2 in Table 1 can remain unchanged, or can also be adjusted according to requirements.

Figure 14:
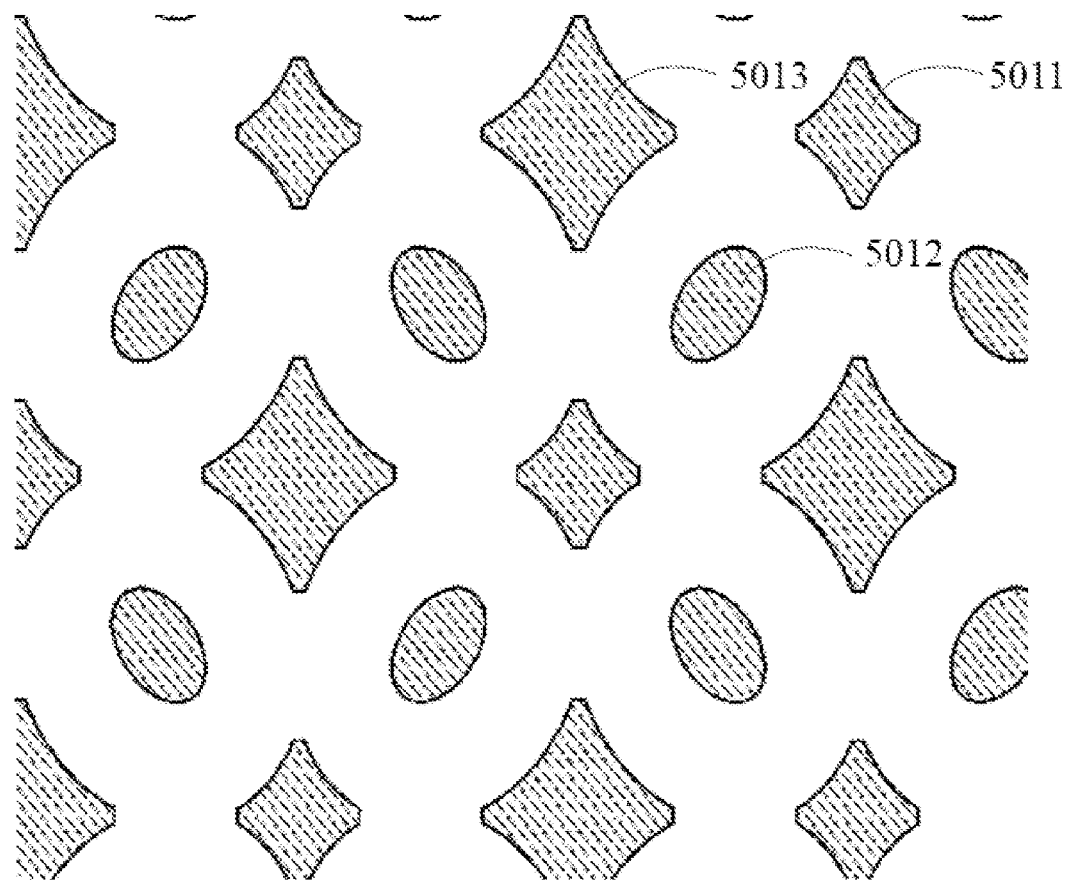
FIG. 14 is a top view of second openings of the display panel of the present application.

In addition, as the second openings 501 correspond to the first openings 201, as illustrated in FIG. 14, the fourth sub-opening 5011 allow red light to pass through, the fifth sub-opening 5012 allow green light to pass through, and the sixth sub-opening 5013 allow blue light to pass through. Chamfers can be configured in the fourth sub-opening 5011 and the sixth sub-opening 5013, and the fifth sub-opening 5012 can be elliptical.

Figure 15:
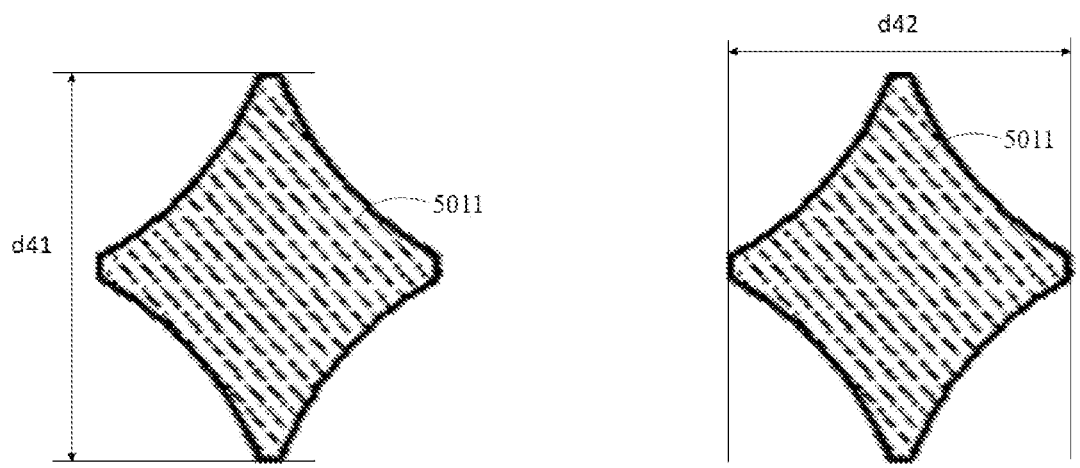
FIG. 15 is a schematic diagram of a fourth sub-opening of the display panel of the present application.
Figure 16:
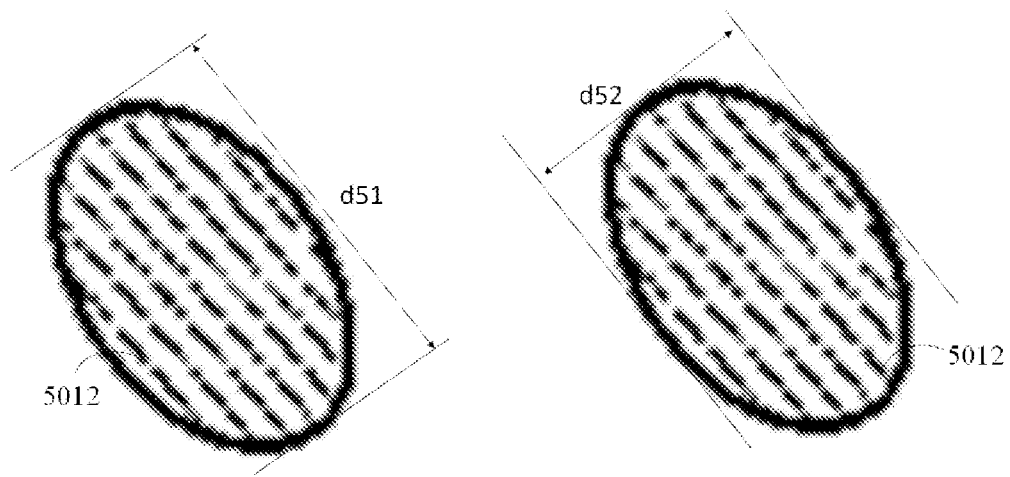
FIG. 16 is a schematic diagram of a fifth sub-opening of the display panel of the present application.
Figure 17:
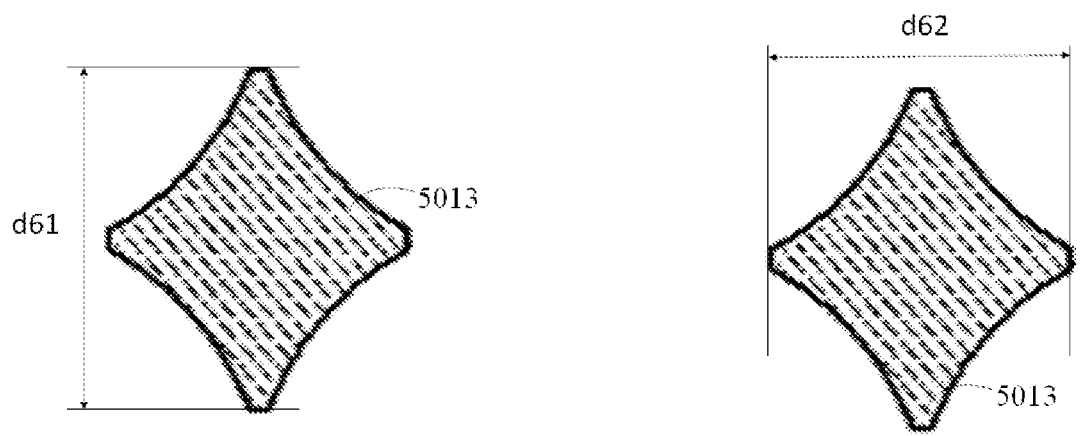
FIG. 17 is a schematic diagram of a sixth sub-opening of the display panel of the present application.

Please refer to FIG. 15 to FIG. 17. Corresponding to number Split1 in table 1, a fourth length d41 of the fourth sub-opening 5011 can be 32.08 µm, a fourth width d42 of the fourth sub-opening 5011 can be 32.08 µm, a fifth length d51 of the fifth sub-opening 5012 can be 25.28 µm, a fifth width d52 of the fifth sub-opening 5012 can be 16.52 µm, a sixth length d61 of the sixth sub-opening 5013 can be 46.4 µm, and a sixth width d62 of the sixth sub-opening 5013 can be 46.4 µm.

Corresponding to number Split2 in table 1, the fourth length d41 of the fourth sub-opening 5011 can be 29.26 µm, the fourth width d42 of the fourth sub-opening 5011 can be 29.26 µm, the fifth length d51 of the fifth sub-opening 5012 can be 25.28 µm, the fifth width d52 of the fifth sub-opening 5012 can be 16.52 µm, the sixth length d61 of the sixth sub-opening 5013 can be 41.42 µm, and the sixth width d62 of the sixth sub-opening 5013 can be 41.42 µm. In other words, compared to the fourth sub-opening 5011 and the sixth sub-opening 5013 in number Split1 in table 1, four corners of the fourth sub-opening 5011 and the sixth sub-opening 5013 of number Split2 in table 1 are retracted. In addition, in one embodiment, radii of curvature of arc parts of the fourth sub-opening 5011 and the sixth sub-opening 5013 of number Split2 in Table 1 can remain unchanged, or can also be adjusted according to requirements.

Corresponding to number Split3 in table 1, the fourth length d41 of the fourth sub-opening 5011 can be 27.28 µm, the fourth width d42 of the fourth sub-opening 5011 can be 27.28 µm, the fifth length d51 of the fifth sub-opening 5012 can be 25.28 µm, the fifth width d52 of the fifth sub-opening 5012 can be 25.28 µm, the sixth length d61 of the sixth sub-opening 5013 can be 37.44 µm, and the sixth width d62 of the sixth sub-opening 5013 can be 37.44 µm. In other words, compared to the fourth sub-opening 5011 and the sixth sub-opening 5013 in number Split1 in table 1, four corners of the fourth sub-opening 5011 and the sixth sub-opening 5013 of number Split3 in table 1 are retracted. In addition, in one embodiment, radii of curvature of arc parts of the fourth sub-opening 5011 and the sixth sub-opening 5013 of number Split2 in Table 1 can remain unchanged, or can also be adjusted according to requirements.

The actual dimensions of the product of the present invention are provided above, but are not limited thereto. For example, the values of the first length d11 and the second length d21 can be adjusted according to requirements, so that the first length d11 and the second length d21 are different.

In summary, in the display panel 10 of the present application, the black matrix layer 500 and the color film layer 600 disposed on the encapsulation layer 400 is used to replace polarizers in the prior art to realize effects of reducing the thickness of the display panel 10 and increasing the light emission rate.

Although the present application has been shown and described with respect to one or more implementations, equivalent alterations and modifications will occur to others skilled in the art based upon a reading and understanding of this specification and the annexed drawings. The present application includes all such modifications and alterations, and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the present application. In addition, while a particular feature of the present application may have been disclosed with respect to only one of several implementations, such features may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

Which mentioned above is preferred embodiments of the present application, it should be noted that to those skilled in the art without departing from the technical theory of the present application, can further make many changes and modifications, and the changes and the modifications should be considered as the scope of protection of the present application.

What is claimed is:

1. A display panel, comprising:
a substrate;
a light-emitting layer disposed on a side of the substrate and comprising a first sub-pixel displaying a first color, a second sub-pixel displaying a second color, and a third sub-pixel displaying a third color;
a color film layer disposed on a side of the light-emitting layer away from the substrate and comprising a first color resist corresponding to the first sub-pixel, a second color resist corresponding to the second sub-pixel, and a third color resist corresponding to the third sub-pixel;
a pixel definition layer disposed between the substrate and the light-emitting layer, wherein a plurality of first openings are defined in the pixel definition layer, and the first sub-pixel, the second sub-pixel, and the third sub-pixel are disposed in the plurality of first openings;
a black matrix layer, wherein the black matrix layer is disposed between the light-emitting layer and the color film layer, a plurality of second openings are defined in the black matrix layer, and the first color resist, the second color resist, and the third color resist are disposed in the plurality of second openings,
wherein a first area ratio of the first color resist to the first sub-pixel is greater than a second area ratio of the second color resist to the second sub-pixel and a third area ratio of the third color resist to the third sub-pixel,
wherein the plurality of first openings comprise a first sub-opening corresponding to the first sub-pixel, a second sub-opening corresponding to the second sub-pixel, and a third sub-opening corresponding to the third sub-pixel; the plurality of second openings comprise a fourth sub-opening corresponding to the first color resist, a fifth sub-opening corresponding to the second color resist, a sixth sub-opening corresponding to the third color resist, chamfers are configured in the fourth sub-opening and the first sub-opening, and chamfers are configured in the sixth sub-opening and the third sub-opening.

2. The display panel as claimed in claim 1, wherein an area of the second openings corresponding to the first sub-pixel and an area of the first color resist are greater than an area of the first sub-pixel; an area of the second openings corresponding to the second sub-pixel and an area of the second color resist are greater than an area of the second sub-pixel; and an area of the second openings corresponding to the third sub-pixel and an area of the third color resist are greater than an area of the third sub-pixel.

3. The display panel as claimed in claim 2, wherein on the side of the substrate where the light-emitting layer is disposed, a first lateral edge of a first orthogonal projection of the color film layer disposed in the second openings completely overlaps with a second orthogonal projection of the black matrix layer.

4. The display panel as claimed in claim 2, wherein on the side of the substrate where the light-emitting layer is disposed, a first lateral edge of a first orthogonal projection of the color film layer disposed in the second openings partially overlaps with a second orthogonal projection of the black matrix layer, and a gap between the first lateral edge of the first orthogonal projection and a second lateral edge of the second orthogonal projection overlaps with a third orthogonal projection of the pixel definition layer.

5. The display panel as claimed in claim 2, wherein on the side of the substrate where the light-emitting layer is disposed, a gap is between a first lateral edge of a first orthogonal projection of the color film layer disposed in the second openings completely and a second lateral edge of a second orthogonal projection of the black matrix layer, and the gap between the first lateral edge of the first orthogonal projection and the second lateral edge of the second orthogonal projection overlaps with a third orthogonal projection of the pixel definition layer.

6. The display panel as claimed in claim 1, wherein a fourth area ratio of the fourth sub-opening to the first sub-opening is greater than a fifth area ratio of the fifth sub-opening to the second sub-opening and a sixth area ratio of the sixth sub-opening to the third sub-opening.

7. The display panel as claimed in claim 6, wherein colors of the first color and the first color resist are same, colors of the second color and the second color resist are same, colors of the third color and the third color resist are same, and the fourth area ratio, the fifth area ratio, and the sixth area ratio range from 1 to 2.5.

8. The display panel as claimed in claim 6, wherein the first color is red, the fourth area ratio of the fourth sub-opening to the first sub-opening ranges from 1.35 to 1.4.

9. The display panel as claimed in claim 6, wherein the second color is green, the fifth area ratio of the fifth sub-opening to the second sub-opening ranges from 0.9 to 1.1, and the fifth sub-opening and the second sub-opening are elliptical.

10. The display panel as claimed in claim 6, wherein the third color is blue, the sixth area ratio of the sixth sub-opening to the third sub-opening ranges from 1.1 to 1.15.

11. A display panel, comprising:
a substrate;
a light-emitting layer disposed on a side of the substrate and comprising a first sub-pixel displaying a first color, a second sub-pixel displaying a second color, and a third sub-pixel displaying a third color;
a color film layer disposed on a side of the light-emitting layer away from the substrate and comprising a first color resist corresponding to the first sub-pixel, a second color resist corresponding to the second sub-pixel, and a third color resist corresponding to the third sub-pixel;
an encapsulation layer disposed on the light-emitting layer;
a pixel definition layer disposed between the substrate and the light-emitting layer, wherein a plurality of first openings are defined in the pixel definition layer, and the first sub-pixel, the second sub-pixel, and the third sub-pixel are disposed in the plurality of first openings;
a black matrix layer, wherein the black matrix layer is disposed between the light-emitting layer and the color film layer, a plurality of second openings are defined in the black matrix layer, and the first color resist, the second color resist, and the third color resist are disposed in the plurality of second openings,
wherein a first area ratio of the first color resist to the first sub-pixel is greater than a second area ratio of the second color resist to the second sub-pixel and a third area ratio of the third color resist to the third sub-pixel,
wherein the plurality of first openings comprise a first sub-opening corresponding to the first sub-pixel, a second sub-opening corresponding to the second sub-pixel, and a third sub-opening corresponding to the third sub-pixel; the plurality of second openings comprise a fourth sub-opening corresponding to the first color resist, a fifth sub-opening corresponding to the second color resist, a sixth sub-opening corresponding to the third color resist, chamfers are configured in the fourth sub-opening and the first sub-opening, and chamfers are configured in the sixth sub-opening and the third sub-opening.

12. The display panel as claimed in claim 11, wherein the display panel further comprises:
a touch structure disposed on the encapsulation layer,
wherein the encapsulation layer covers the light-emitting layer and the pixel definition layer.

13. The display panel as claimed in claim 12, wherein the touch structure comprises a metal wiring layer, and an orthogonal projection of the black matrix layer completely covers the metal wiring layer in a surface of the substrate where the pixel definition layer is disposed.

14. The display panel as claimed in claim 12, wherein an area of the second openings corresponding to the first sub-pixel and an area of the first color resist are greater than an area of the first sub-pixel; an area of the second openings corresponding to the second sub-pixel and an area of the second color resist are greater than an area of the second sub-pixel; and an area of the second openings corresponding to the third sub-pixel and an area of the third color resist are greater than an area of the third sub-pixel.

15. The display panel as claimed in claim 14, wherein on the side of the substrate where the light-emitting layer is disposed, a first lateral edge of a first orthogonal projection of the color film layer disposed in the second openings completely overlaps with a second orthogonal projection of the black matrix layer.

16. The display panel as claimed in claim 14, wherein on the side of the substrate where the light-emitting layer is disposed, a first lateral edge of a first orthogonal projection of the color film layer disposed in the second openings partially overlaps with a second orthogonal projection of the black matrix layer, and a gap between the first lateral edge of the first orthogonal projection and a second lateral edge of the second orthogonal projection overlaps with a third orthogonal projection of the pixel definition layer.

17. The display panel as claimed in claim 14, wherein on the side of the substrate where the light-emitting layer is disposed, a gap is between a first lateral edge of a first orthogonal projection of the color film layer disposed in the second openings and a second lateral edge of a second orthogonal projection of the black matrix layer, and the gap between the first lateral edge of the first orthogonal projection and the second lateral edge of the second orthogonal projection overlaps with a third orthogonal projection of the pixel definition layer.

18. The display panel as claimed in claim 12, wherein a fourth area ratio of the fourth sub-opening to the first sub-opening is greater than a fifth area ratio of the fifth sub-opening to the second sub-opening and a sixth area ratio of the sixth sub-opening to the third sub-opening.

19. The display panel as claimed in claim 18, wherein colors of the first color and the first color resist are same, colors of the second color and the second color resist are same, colors of the third color and the third color resist are same, and the fourth area ratio, the fifth area ratio, and the sixth area ratio range from 1 to 2.5.

* * * * *